United States Patent [19]

Schuermann

[11] 4,179,668

[45] Dec. 18, 1979

[54] HF-AMPLIFIER CIRCUIT

[75] Inventor: Josef H. Schuermann, Oberhummel, Fed. Rep. of Germany

[73] Assignee: Texas Instruments Deutschland GmbH, Freising, Fed. Rep. of Germany

[21] Appl. No.: 881,105

[22] Filed: Feb. 24, 1978

[30] Foreign Application Priority Data

Mar. 3, 1977 [DE] Fed. Rep. of Germany ....... 2709314

[51] Int. Cl.² ............................................. H03F 3/16
[52] U.S. Cl. .................................. 330/277; 330/296; 357/15; 357/23
[58] Field of Search ....................... 330/277, 307, 296; 357/15, 23

[56] References Cited

U.S. PATENT DOCUMENTS

| | | | |
|---|---|---|---|
| 3,391,354 | 7/1968 | Ohashi et al. | 357/23 X |
| 3,872,491 | 3/1975 | Hanson et al. | 330/277 X |
| 3,917,964 | 11/1975 | Carlson | 330/277 X |
| 3,955,154 | 5/1976 | Sasaki et al. | 357/23 X |

Primary Examiner—Lawrence J. Dahl
Attorney, Agent, or Firm—Mel Sharp; James T. Comfort; N. Rhys Merrett

[57] ABSTRACT

A high frequency amplifier circuit comprising a gated field effect transistor operated in common gate configuration with one of the two gate electrodes connected to the substrate of the field effect transistor. Transistors using two insulated gates or having one insulated gate and either a Schottky barrier junction or a pn junction gate may be used. AGC amplifier and mixer circuit configurations are described. By use of the basic configuration described, high frequency stability of the amplifier is significantly improved.

18 Claims, 6 Drawing Figures

Fig.1
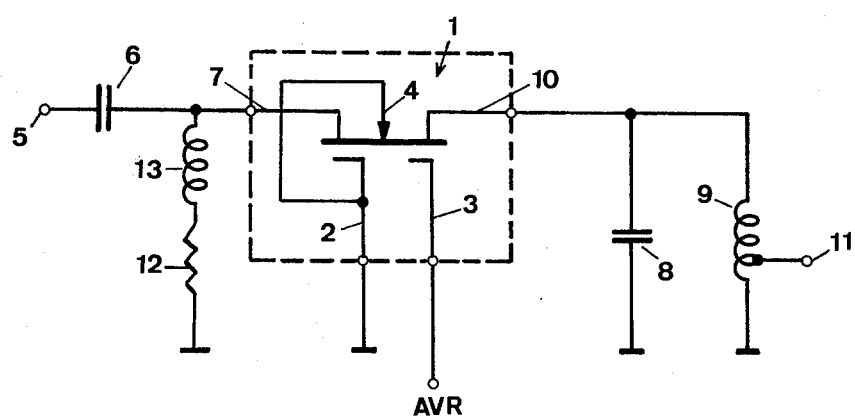
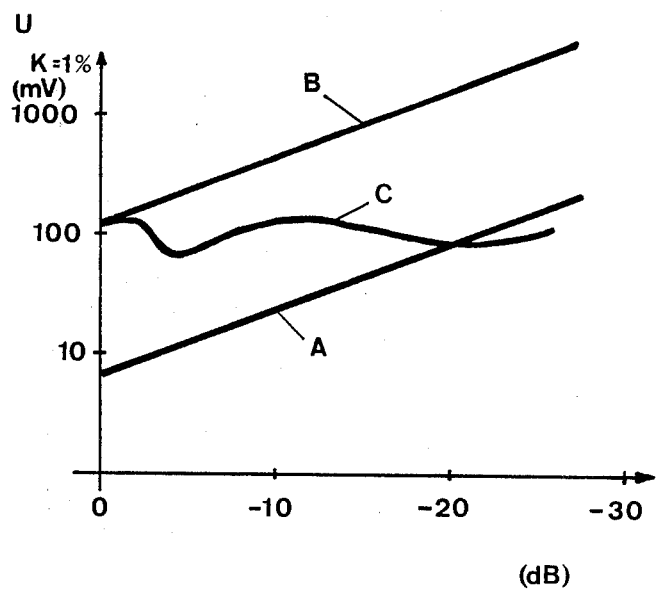
Fig.2

HF-AMPLIFIER CIRCUIT

This invention relates to an HF-amplifier circuit comprising a gated MOS field-effect transistor in common gate connection.

In MOS field-effect transistors, it is standard practice to connect the substrate of the transistor to the source electrode. This measure is applied to prevent the diode formed between the substrate and the channel of the field-effect transistor from being biassed in the forward direction. In cases where an MOS field-effect transistor such as this is intended to be used in a common gate circuit for HF-amplification it is a disadvantage to connect the substrate to the source electrode because this produces a high feedback capacitance between the signal input formed by the source electrode and the amplifier output formed by the drain electrode. This feedback capacitance seriously impairs the stability of the amplifier circuit at high frequencies.

An object of the invention is to design an HF-amplifier circuit of the type described above in such a way that its HF stability is considerably improved.

According to the invention, this object is achieved by virtue of the fact that the field effect transistor comprises two gate electrodes and by virtue of the fact that one of the two gate electrodes is connected to the substrate of the field effect transistor.

By virtue of the connection between one of the two gate electrodes and the substrate, the feedback capacitance of the field-effect transistor from the output circuit to the input circuit is considerably reduced which results in an improvement in the HF stability.

According to one embodiment of the invention, a gain control voltage is with advantage applied to that gate electrode which is not connected to the substrate. This embodiment enables the gain to be controlled down in the presence of large signals at the amplifier input, so that high cross modulation stability can be obtained over a wide range.

According to another embodiment of the invention, a voltage divider may also be connected between the gate electrode connected to the substrate and the drain electrode of the field-effect transistor, comprising a tap connected to the other gate electrode. With this circuit, the gate electrode which is not connected to the substrate is placed at a fixed bias so that a selectable fixed gain factor is obtained. In order to vary the gain factor, that section of the voltage divider which is situated between the two gate electrodes may also be a variable resistor.

Advantageously, one gate electrode is formed by a metal coating, which forms a Schottky junction with the substrate, or by a PN junction, while the other gate electrode is formed by a metal coating on an insulating layer on the substrate. In thsi embodiment, it is possible to obtain a higher cut-off frequency of the amplifier circuit.

In cases where it is used as a mixing stage, circuit embodying the invention is with advantage designed in such a way that an input signal is applied to the source electrode and the output signal of a heterodyning oscillator is applied to the source electrode or to one of the two gate electrodes. In a mixing stage such as this, gain control is also possible through one of the gate electrodes.

The junction formed between the substrate and the channel of the field-effect transistor may be prevented from changing into the forward state by connecting one terminal of a biassing resistor to the source electrode of the field-effect transistor, its other terminal lying at the potential of the gate electrode connected to the substrate.

Embodiments of the invention will be described by way of example with reference to the accompanying drawings, wherein: p FIG. 1 shows an HF-amplifier circuit embodying the invention.

FIG. 2 is a diagram showing the cross modulation stability of known HF-amplifiers and of an amplifier circuit according to the invention in dependence upon the gain control.

Figure 3:
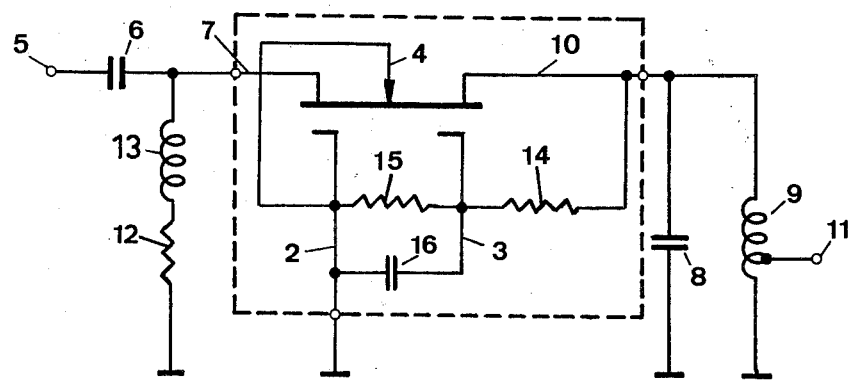
FIG. 3 is a circuit diagram of another embodiment of an amplifier circuit according to the invention.

The HF-amplifier circuit shown in FIG. 1 contains an MOS-field-effect transistor 1 which comprises two gate electrodes 2 and 3. The gate electrode 2 is connected to the substrate 4 of the transistor 1. The signal applied to the input 5 of the circuit is delivered through a coupling capacitor to the source electrode 7 of the transistor, while the output signal is released through an oscillating circuit of a capacitor 8 and a coil 9 which is connected to the drain electrode 10 of the transistor. The circuit output 11 is connected to a tap of the coil 9.

The MOS transistor 1 is operated in common gate configuration and the gate electrode 2 belongs in common to the input circuit and to the output circuit.

A fixed bias is applied to the source electrode 7 of the MOS transistor 1 through a resistor 12, preventing the diode formed between the transistor substrate and the channel from changing into the forward state. An inductance 13 between the resistor 12 and the source electrode 7 is used for HF-decoupling.

The connection between the substrate 4 and the gate electrode 2 produces a marked reduction in the feedback capacitance between the signal input and the signal output and, hence, provides for high HF-stability.

A voltage may be applied through the gate electrode 3 to the field-effect transistor 1 for automatic gain control. The application of this AGC-voltage improves the large signal behavior of the amplifier circuit very considerably by virtue of the favorable influence which it has upon the cross modulation stability. No additional circuits are required for obtaining the high cross modulation stability. FIG. 2 shows the trend of the cross modulation stability in dependence upon the gain control. The curve A represents the interference voltage $U_{Stor}$ for a cross modulation factor K of 1% for an amplifier circuit working with bipolar transistors, the gain control being obtained by means of a PIN diode network. The curve B represents the cross modulation stability of an amplifier circuit with a gated field-effect transistor comprising one gate electrode. In this case, too, gain control is obtained by means of a PIN diode network. The HF-amplifier circuit shown in FIG. 1 gives the cross modulation stability represented by curve C. It can be seen that a substantially constant interference voltage $U_{Stor}$ is obtained over the entire control range without any need for an additional PIN diode network.

In cases where there is no need for automatic gain control, it is possible to use the circuit shown in FIG. 3 in which the gate electrode 3 is applied to a fixed bias through a voltage divider of the resistors 14 and 15. In this circuit, the connection point of the resistors 14 and 15 is connected to the gate electrode 3 and the resistor 15 lies between the gate electrodes 2 and 3. The two gate electrodes are connected to one another through a capacitor 16 so that in the gate circuit applied, in which the gate electrode 2 is grounded, the gate electrode 3 is also connected to ground in high frequency terms. In this circuit, too, the connection present between the substrate of the field effect transistor and the gate electrode 2 provides for high stability because the troublesome feedback capacitance is reduced in this case, too.

The section of the amplifier circuit surrounded by a chain line in FIG. 3 may be produced in the form of an integrated circuit on a single semiconductor substrate. In this case, the capacitor 16 may also be in the form of an MOS capacitor or in the form of a junction capacitor.

Figure 4:
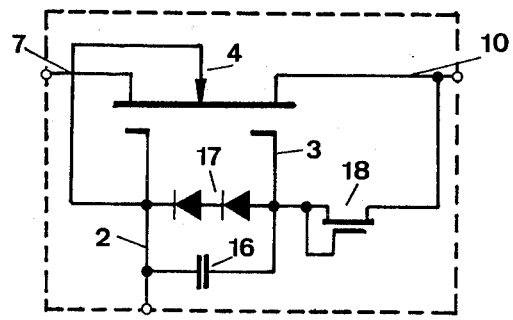
FIGS. 4 and 5 show modified sections of amplifier circuits embodying the invention which may be used instead of the section surrounded by a chain line in FIG. 3.
Figure 5:
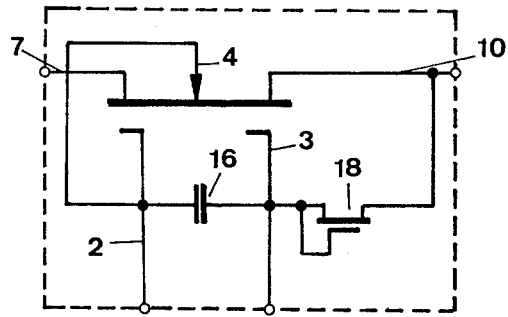

FIGS. 4 and 5 show examples of how the integrated circuit surrounded by the chain line can be realized in addition to the embodiment of FIG. 3. As shown in FIG. 4, the resistance lying between the two gate electrodes may be in the form of a diode chain 17 which gives a constant voltage at the gate electrode 3 and a low dynamic impedance between the gate electrode 3 and ground or the first gate electrode 2 so that, at high frequencies, the capacitor 16 can be made small or can be left out altogether. The resistor 14 may be formed by a field effect transistor 18 connected to act as a constant current source. This avoids ohmic damping of the output circuit.

In the embodiment illustrated in FIG. 5, that part of the voltage divider lying between the two gate electrodes is not contained in the integrated circuit surrounded by the chain line, instead the two gate electrodes are connected to external connections 19 and 20. This enables a variable resistor to be introduced between the two gate electrodes so that, by varying the value of this resistor, the gain can also be varied.

Figure 6:
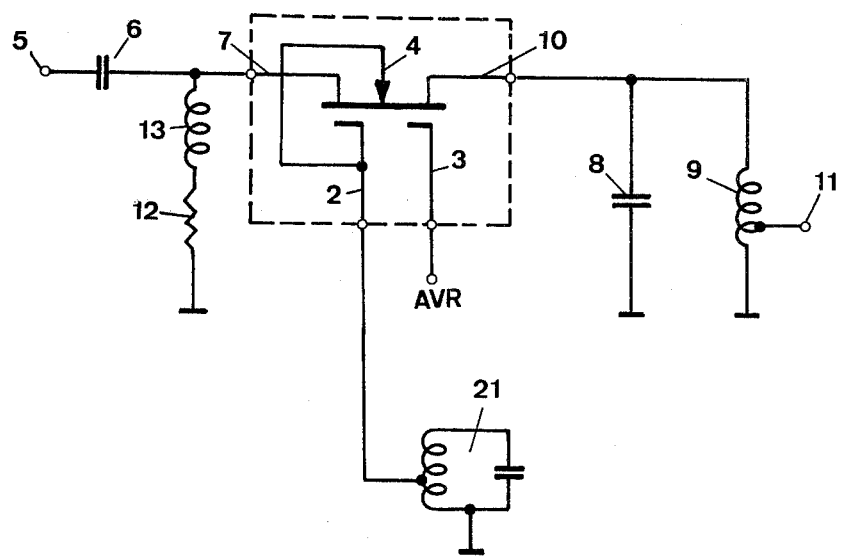
FIG. 6 shows an embodiment of a circuit embodying the invention used as a mixing stage.

FIG. 6 illustrates an embodiment of the amplifier circuit showing how this circuit can be used as a mixing stage. As can be seen, the gate electrode 2 in this embodiment is connected to an oscillating circuit 21 of a heterodyning oscillator so that the output signal of this heterodyning oscillator is mixed with the signal delivered to the input terminal 5. In this embodiment, too, a voltage may be applied to the gate electrode 3 for automatic gain control so that favorable large signal behavior is obtained. Signal mixing may also be obtained when the output signal of the heterodyning oscillator is applied together with the input signal to the source electrode 7 of the field effect transistor 1. In this case, the two gate electrodes are grounded in high frequency terms. It is also possible to apply the oscillator output signal to the gate electrode 3 at the same time as applying the gate electrode 2 to ground in order to obtain the required mixing effect.

Despite limited outlay in terms of circuitry, the described HF-amplifier circuit provides for stable high frequency amplification and also for a high cross modulation stability over a wide control range when use is made of the possibility of gain control. The feedback capacitance between the output circuit and the input circuit which adversely affects stability is greatly reduced by the connection present in all embodiments between the substrate of the field effect transistor and one of the gate electrodes.

If it is desired to obtain a higher cut-off frequency of the amplifier circuit, one of the gate electrodes, preferably the gate 2, may be formed by a Schottky junction or by a PN junction on the semiconductor substrate and the other gate electrode by a metal coating on an insulating layer on the semiconductor substrate.

What is claimed is:

1. A high frequency amplifier circuit comprising a gated field effect transistor including a semiconductor substrate incorporating source and drain regions having respective source and drain electrodes, a channel region interposed between said source and drain regions, two gate electrode means disposed between the source electrode and the drain electrode for electrical cooperation with the channel region to control current carrier flow between the source and drain regions, wherein said substrate is connected by direct connection means solely to one of said gate electrodes, input means coupled to said source electrode for application of high frequency input signals to said source electrode, output means coupled to said drain electrode for deriving output signals from said drain electrode, means for coupling a control voltage at least to the other one of said gate electrodes; and bias resistor means having one terminal connected to said source electrode and a further terminal connected with said one gate electrode means to a common potential.

2. A circuit as claimed in claim 1, including means for applying an automatic gain control voltage to the other one of said gate electrode means.

3. A circuit as claimed in claim 1, further including voltage divider means connected between said one gate electrode means and said drain electrode, said voltage divider means including a tap connected to said other gate electrode means.

4. A circuit as claimed in claim 3, wherein the section of the voltage divider connected between the two gate electrode means comprises semiconductor diode means.

5. A circuit as claimed in claim 3, wherein the section of the voltage divider means connected between said other gate electrode means and said drain electrode comprises field effect transistor means having a source electrode connected to a gate electrode to function as a constant current source.

6. A circuit as claimed in claim 3, wherein the section of the voltage divider means connected between the two gate electrode means comprises a variable resistor.

7. A circuit as claimed in claim 3, further including capacitor means connecting said gate electrode means.

8. A circuit as claimed in claim 7, wherein said capacitor means comprises semiconductor circuit element capacitor means having at least one one region provided in said semiconductor substrate.

9. A circuit as claimed in claim 1, wherein said two gate electrode means comprise a first gate electrode formed by a metal coating which forms a Schottky barrier junction with part of said channel region and a second gate electrode formed by a metal coating on an insulating layer overlying another part of said channel region.

10. A circuit as claimed in claim 1, for use as a mixing stage, including means for applying an input signal to said source electrode and means for coupling the output signal of a heterodyne isolator to one of said gate electrode means.

11. A high frequency amplifier circuit comprising a gated field effect transistor having a semiconductor substrate incorporating source and drain regions having respective source and drain electrodes, a channel region interposed between said drain regions, two gate electrode means disposed between the source electrode and the drain electrode for cooperation with the channel to control current carrier flow between the source and the drain regions; means connecting said substrate by direct connection solely to one of said gate electrode means; bias resistance means having one end connected to said source electrode, and means connecting the other end of said bias resistor means and said other gate electrode means to a common reference potential; and voltage divider means connected between the said one gate electrode means and the said drain electrode, said voltage divider means including a tap connected to said other gate electrode means.

12. A circuit according to claim 11, wherein said voltage divider means comprises semiconductor circuit element means having at least one region provided in said semiconductor substrate.

13. A circuit element according to claim 12, wherein said voltage divider means includes semiconductor diode means connected between said one and said other gate electrode means, and constant current source field effect transistor means connected between said other gate electrode means and said drain electrode.

14. A circuit according to claim 13, including semiconductor capacitative circuit element means having at least one region provided in said semiconductor substrate, said capacitative circuit element means connected between said one and said other gate electrode means.

15. A circuit according to claim 14, wherein said capacitative circuit element means comprises a metal-insulator-semiconductor capacitor circuit means.

16. A circuit element according to claim 14, wherein said capacitative circuit element means comprises pn junction capacitative circuit element means.

17. A circuit according to claim 13 wherein said gated field effect transistor means includes insulated gate electrode means and pn junction gate electrode means.

18. A circuit according to claim 13 wherein wherein said two gate electrode means comprise a first gate electrode formed by a metal coating which forms a Schottky barrier junction with part of said channel region and a second gate electrode formed by a metal coating on an insulating layer overlying another part of said channel region.

* * * * *